(12) United States Patent
Schelling et al.

(10) Patent No.: US 9,738,509 B2
(45) Date of Patent: Aug. 22, 2017

(54) MICROMECHANICAL COMPONENT HAVING A DIAPHRAGM STRUCTURE

(71) Applicant: Robert Bosch GmbH, Stuttgart (DE)

(72) Inventors: Christoph Schelling, Stuttgart (DE); Jochen Zoellin, Muellheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/764,259

(22) PCT Filed: Jan. 3, 2014

(86) PCT No.: PCT/EP2014/050038
§ 371 (c)(1),
(2) Date: Jul. 29, 2015

(87) PCT Pub. No.: WO2014/121955
PCT Pub. Date: Aug. 14, 2014

(65) Prior Publication Data
US 2015/0375991 A1    Dec. 31, 2015

(30) Foreign Application Priority Data

Feb. 5, 2013 (DE) .................. 10 2013 201 795

(51) Int. Cl.
*B81B 3/00* (2006.01)

(52) U.S. Cl.
CPC .... *B81B 3/0072* (2013.01); *B81B 2201/0257* (2013.01); *B81B 2203/0118* (2013.01);
(Continued)

(58) Field of Classification Search
CPC .......... B81B 3/0072; B81B 2201/0257; B81B 2203/0118; B81B 2203/0127;
(Continued)

(56) References Cited

U.S. PATENT DOCUMENTS 7,023,066 B2   4/2006   Lee et al.
8,045,733 B2   10/2011  Zhe et al.
(Continued)

FOREIGN PATENT DOCUMENTS

| CN | 1589587 A   | 3/2005  |
| CN | 102244829 A | 11/2011 |
| DE | 693 25 732  | 4/2000  |

OTHER PUBLICATIONS

International Search Report for PCT/EP2014/050038, dated Jun. 4, 2014.

*Primary Examiner* — Fernando L Toledo
*Assistant Examiner* — Neil Prasad
(74) *Attorney, Agent, or Firm* — Norton Rose Fulbright US LLP; Gerard Messina

(57) ABSTRACT

A diaphragm structure of a micromechanical component includes: a diaphragm integrated via at least one spring element into a layered structure, the diaphragm spanning a cavern, so that at least one section of the diaphragm edge extends up to and beyond the edge area of the cavern; and an anchoring structure formed in the overlap area between the diaphragm and the cavern edge area. The anchoring structure includes at least one anchor element structured out of the layered structure above the cavern edge area, and one through opening for the anchor element formed in the edge area of the diaphragm, so that there is a clearance between the anchor element and the through opening which allows for a mechanical stress relaxation of the diaphragm.

26 Claims, 3 Drawing Sheets

(52) U.S. Cl.
CPC ............. *B81B 2203/0127* (2013.01); *B81B 2203/0163* (2013.01); *B81B 2203/0307* (2013.01); *B81B 2203/04* (2013.01)

(58) Field of Classification Search
CPC .... B81B 2203/0163; B81B 2203/0307; B81B 2203/04
See application file for complete search history.

(56) References Cited

U.S. PATENT DOCUMENTS

| | | |
|---|---|---|
| 2006/0233401 A1 | 10/2006 | Wang |
| 2006/0280319 A1 | 12/2006 | Wang et al. |
| 2007/0003082 A1 | 1/2007 | Pedersen |
| 2009/0092273 A1 | 4/2009 | Zhe et al. |
| 2014/0133685 A1* | 5/2014 | Liu .......................... H04R 7/20 381/355 |
| 2014/0217521 A1* | 8/2014 | Johari-Galle ....... B81C 1/00134 257/415 |
| 2015/0078589 A1* | 3/2015 | Uchida ................. H04R 31/00 381/174 |

* cited by examiner

MICROMECHANICAL COMPONENT HAVING A DIAPHRAGM STRUCTURE

BACKGROUND OF THE INVENTION

1. Field of the Invention

The present invention relates to a micromechanical component having a diaphragm structure which is implemented in a layered structure on a substrate. The diaphragm structure includes a diaphragm which is integrated via at least one spring element into the layered structure and spans a cavern, so that at least one section of the diaphragm edge extends up to and beyond the edge area of the cavern. At least one anchoring structure is formed in the overlap area between the diaphragm and the cavern edge area.

2. Description of the Related Art

The diaphragm structure of a micromechanical component may be devised for various applications, e.g., as a diaphragm for detecting pressure, as a microphone or a loudspeaker diaphragm, or also as a closing element of a micromechanical valve. Since the mechanical stress state of the diaphragm in most cases has an effect on the functionality of the component, the diaphragm should have a preferably precisely defined mechanical stress state in the case of applications of this type. Under certain circumstances, this requires compromises when it comes to the material selection and/or the actually implemented stress state. In any case, manufacture-related mechanical stress states already occur in the diaphragm layers which are often not optimally suitable for the particular component functions.

One important application for the micromechanical components having a diaphragm structure which are discussed here is the utilization as a microphone component. Microphone diaphragms should preferably be stress-free and, at the same time, be preferably closed off all around in an airtight manner, so that there is preferably little flow around the diaphragm edge.

In US Patent Application Publication No. 2006/0280319 A1, a microphone component of the type mentioned at the outset is described. The microphone structure of this micromechanical component is implemented in a layered structure on a semiconductor substrate and spans a cavern in the substrate back side. The microphone structure includes a diaphragm and a fixed, acoustically permeable counter element including through openings. In the present case, the counter element is located below the diaphragm, i.e., between the substrate and the diaphragm. It is used as a carrier of a fixed electrode which, together with an electrode on the deflectable diaphragm, forms a capacitor system for signal detection. The diaphragm is integrated into the layered structure merely via one or multiple cantilever beam(s), so that manufacture-related mechanical stresses may be well relieved within the diaphragm. The diaphragm extends up to and beyond the edge area of the cavern, where a circumferential groove is formed at the diaphragm edge in the layered structure. This groove is primarily used for acoustically sealing the diaphragm, but also functions as an anchoring structure and an overload protection.

BRIEF SUMMARY OF THE INVENTION

With the aid of the present invention, one alternative concept which may be implemented cost-effectively with the aid of standard processes of the semiconductor processing is provided for implementing micromechanical components having a largely stress-free diaphragm structure including an edge anchorage.

Accordingly, the anchoring structure for the diaphragm of a component according to the present invention includes at least one anchor element and one through opening for the anchor element. The anchor element is structured out of the layered structure above the cavern edge area and the through opening for the anchor element is formed in the edge area of the diaphragm, so that there is a clearance between the anchor element and the through opening. This clearance allows for a mechanical stress relaxation of the diaphragm.

The anchoring structure of the component according to the present invention is thus designed in such a way that the diaphragm is fixed at least laterally, but that it is still possible to relieve mechanical stresses within the diaphragm, which are, for example, manufacture- or temperature-related. The anchorage concept according to the present invention therefore allows for a very flexible design of the diaphragm, namely not only as far as the layout is concerned, but also with regard to the material selection.

There are in principle different possibilities of implementing a component according to the present invention or its components, in particular the anchoring structure, but also the diaphragm suspension and structure.

In this way, the anchoring structure, depending on the size, shape, and function of the diaphragm, may include only one anchor element including the corresponding through opening or also multiple anchor elements and through openings which are situated in such a way that they are distributed across the edge area of the cavern or diaphragm.

The anchor elements may involve simply pin-shaped extensions which protrude from the cavern edge area and into the corresponding through openings in the edge area of the diaphragm, but which do not emerge from the diaphragm surface. In this case, the anchor elements do not have an effect on the "out-of-plane" movement of the diaphragm.

In one preferred specific embodiment of the present invention, the foot of the anchor element is fixedly connected to the cavern edge area below the diaphragm, while the head of the anchor element is structured out of at least one layer above the diaphragm and extends at least in one section up to and beyond the edge area of the through opening in the diaphragm. When the mechanical clearance between the anchor head and the diaphragm is designed to be correspondingly small, the anchoring structure may in this case also be used for vertically fixing the diaphragm.

The anchor element having the anchor head may, however, also be devised as a stop for the "out-of-plane" movement of the diaphragm. In this case, the mechanical clearance between the anchor head and the diaphragm determines the maximally vertical deflection of the diaphragm. A stop of this type may, for example, be used as an overload protection for the diaphragm.

In some applications, anchor elements including anchor heads may, however, also be used for defining an application-specific setpoint position of the diaphragm, e.g., for carrying out a function test or, however, also for improving the component performance. In this way, the anchor elements including anchor heads may be used as a stop in the case of a microphone component according to the present invention, against which the diaphragm is moved with the aid of suitable controllable circuit means. The diaphragm is then kept in this position during the operation of the microphone and thus acted on by a defined mechanical pre-stressing for the purpose of increasing the microphone sensitivity.

The diaphragm of the component according to the present invention is integrated via at least one cantilever beam into the layered structure of the component, while the diaphragm edge is otherwise separated from the layered structure. This type of diaphragm suspension allows for an almost complete relief of mechanical stresses within the diaphragm. In applications which are based on a diaphragm deflection vertically to the layered planes, the cantilever beam should have a suitable elasticity at least in this direction, i.e., "out-of-plane." The cantilever beam may, however also be implemented in the form of an "out-of-plane" as well as an "in-plane" elastic spring element. In this case, not only mechanical stresses within the diaphragm, but also intrinsic mechanical stresses of the entire component structure may be relieved via the diaphragm suspension.

Many applications, e.g., pressure measurements, microphone function, and loudspeaker function, require a more or less extensive edge sealing of the diaphragm structure of the component according to the present invention. An edge sealing of this type may be simply implemented in the form of at least one sealing lip which is formed in the overlap area between the diaphragm and the cavern edge area. A sealing lip of this type may be formed on the cavern edge area as well as on the bottom side of the diaphragm which faces the cavern edge area. Advantageously, the anchoring structure is situated between the sealing lip and the outer edge of the diaphragm in such a way that the central area of the diaphragm is sealed off by the sealing lip and the component function is not impaired by the leakage of the anchoring structure.

For some applications, a "hat-shaped" diaphragm proves advantageous including a central area which is connected via a side area to the edge area of the diaphragm, so that the central area is essentially formed to be plane parallel, but offset with regard to the edge area. This diaphragm structure may be easily stabilized with the aid of corrugations in the side area. It is preferably used within the scope of microphone components in which the "out-of-plane" deflection of the diaphragm is detected as a microphone signal.

In one preferred embodiment variant of a microphone component according to the present invention, the signal detection takes place capacitively. An electrode of the capacitor system which is necessary therefor is situated on the diaphragm and is deflected together with the diaphragm in the case of sound impact. The fixed counter electrode of this capacitor system is situated on an acoustically permeable counter element including through openings which are formed above and/or below the diaphragm in the layered structure.

DETAILED DESCRIPTION OF THE INVENTION

Figure 1A:
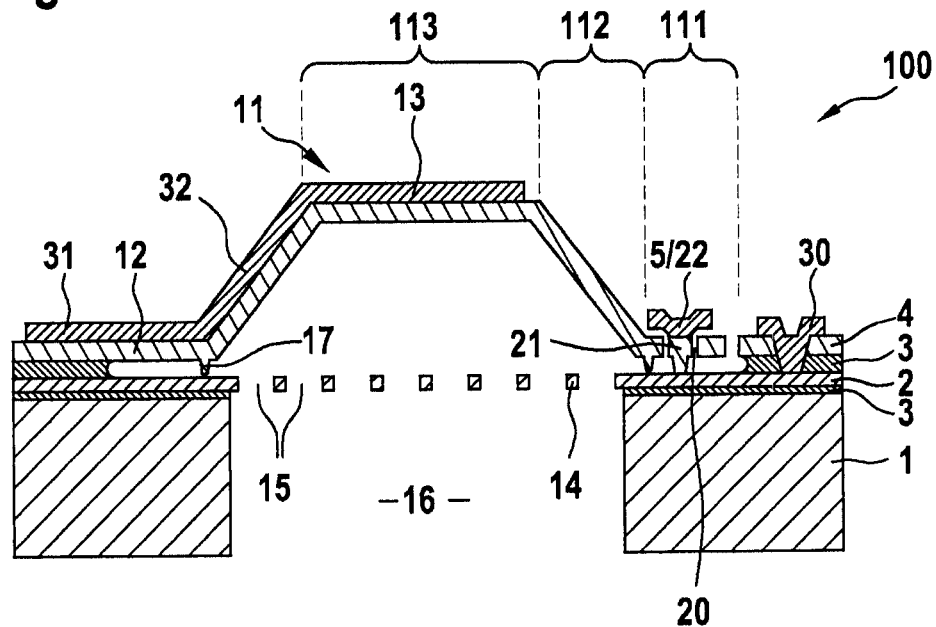
FIG. 1a shows a schematic sectional representation of a first microphone component 100 according to the present invention including a back plate.

The component according to the present invention illustrated in FIGS. 1a, b is a capacitive microphone component 100 the microphone structure of which is implemented in a layered structure above a semiconductor substrate 1 and spans a cavern 16 in the back side of substrate 1. The microphone structure includes a sound-pressure sensitive diaphragm 11, on which a diaphragm electrode 13 is situated, and a fixed, acoustically permeable counter element 14 including through openings 15 situated in a raster-shaped manner which is provided with a counter electrode which is not denoted here in greater detail. Diaphragm electrode 13 which is deflectable together with diaphragm 11 and the fixed counter electrode together form a capacitor system for signal detection.

In the exemplary embodiment illustrated here, counter element 14 including the counter electrode is formed in an electrically conductive layer 2 between substrate 1 and a functional layer 4 for diaphragm 11, this conductive layer 2 being non-conductive in each case through at least one dielectric intermediate layer 3 against substrate 1 on the one hand and functional layer 4 on the other hand. The electrical contacting of counter element 14, which is also referred to as a back plate due to its position below diaphragm 11, takes place via a back plate contact 30 which is situated next to the diaphragm area on the component surface and is implemented in the form of a via through the layered structure up to conductive layer 2.

Diaphragm 11 is a cantilever beam diaphragm which is integrated into the component structure only via a cantilever-beam-like spring element 12, but is otherwise completely separated from the layered structure. In the exemplary embodiment illustrated here, circular diaphragm 11 includes three areas, which are formed concentrically to one another, namely a central area 113, a side area 112 and an edge area 113 which form the individual sections of "hat-shaped" diaphragm 11. Edge area 111 is oriented in parallel to layer 2 of counter element 14 and extends up to and beyond the edge area of cavern 16 at a relatively small distance to this layer 2. Central area 113, which is situated centrically to cavern 16 and is also oriented in parallel to counter element 14, is connected to edge area 111 via side area 112, so that the distance between central area 113 and counter element 14 is significantly larger than the distance between edge area 111 and layer 2 of counter element 14.

Diaphragm electrode 13 essentially extends across entire central area 113 of diaphragm 11. It is electrically connected via a connecting line 32, which is guided over cantilever beam 12, to a diaphragm connection 31 which is situated laterally next to the diaphragm area of the component surface.

In the overlap area between diaphragm 11 and edge area of cavern 16, an anchoring structure is formed which supplements the diaphragm suspension in the form of cantilever beam 12. According to the present invention, this anchoring structure includes anchor elements 21 and through openings 20 for anchor elements 21. Anchor elements 21 are structured out of the layered structure above the edge area of cavern 16 and through openings 20 are formed in edge area 111 of diaphragm 11. In this case, anchor elements 21 and through openings 20 of the anchoring structure are designed in such a way that the mechanical clearance between anchor elements 21 and corresponding through openings 20 allows for the mechanical stresses within diaphragm 11 to be relieved.

In the exemplary embodiment illustrated here, anchor elements 21 are implemented in the form of pin-shaped extensions which extend from layer 2 of counter element 14 via dielectric intermediate layer 3 and diaphragm layer 4 up into a metal layer 5 on functional layer 4. In this metal layer 5, an anchor head 22 for each anchor element 21 is formed in each case, this anchor head extending at least sectionally up to and beyond the edge area of the particular through opening 20 in diaphragm 11, a distance existing in this case between anchor heads 22 and the diaphragm plane in edge area 111. This distance determines the maximum "out-of-plane" deflection of diaphragm 11. Anchor heads 22 form in this case a stop which delimits the deflection of diaphragm 11 in overload situations.

Furthermore, a sealing lip 17 for acoustically sealing the microphone structure is formed in the overlap area between diaphragm 11 and the edge area of cavern 16, namely on the bottom side of diaphragm 11. This circularly closed sealing lip 17 is situated in edge area 111 of diaphragm 11, so that through openings 20 of the anchoring structure are situated between sealing lip 17 and the outer edge of diaphragm 11 and thus do not have a negative effect on the acoustic properties of the microphone structure.

Figure 1B:
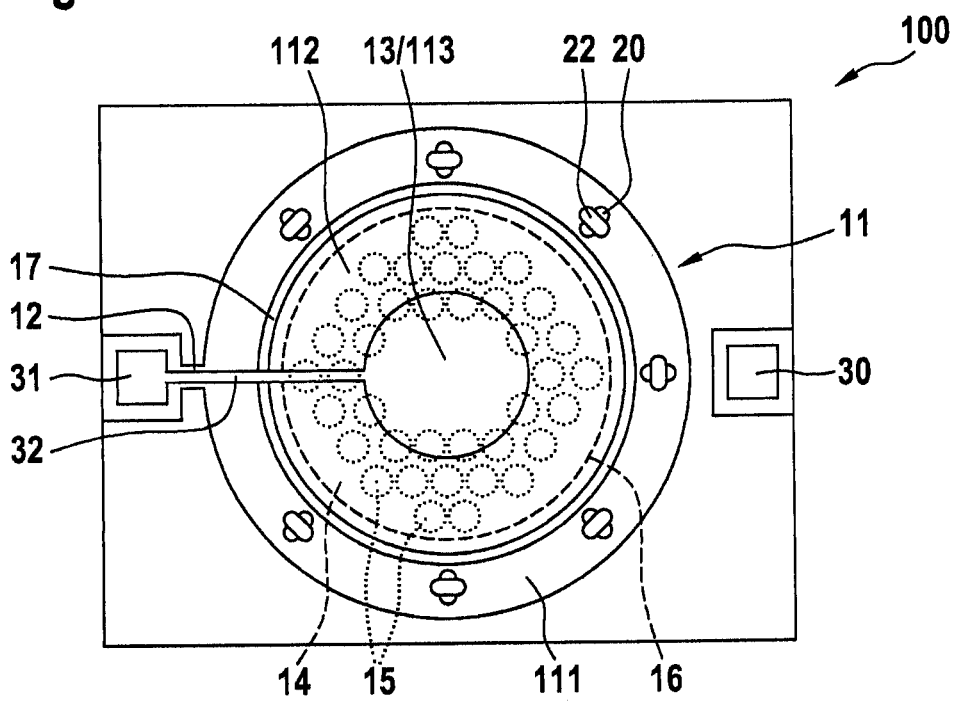
FIG. 1b shows a schematic top view of the layered structure of microphone component 100.

The layered structure of microphone component 100 according to the present invention including anchor elements 21 and corresponding through openings 20 as well as the structure and "hat-shaped" diaphragm 11 is illustrated particularly well by FIG. 1a; FIG. 1b illustrates the component layout and, in particular, the design and configuration of anchor elements 21 and corresponding through openings 20.

Figure 2:
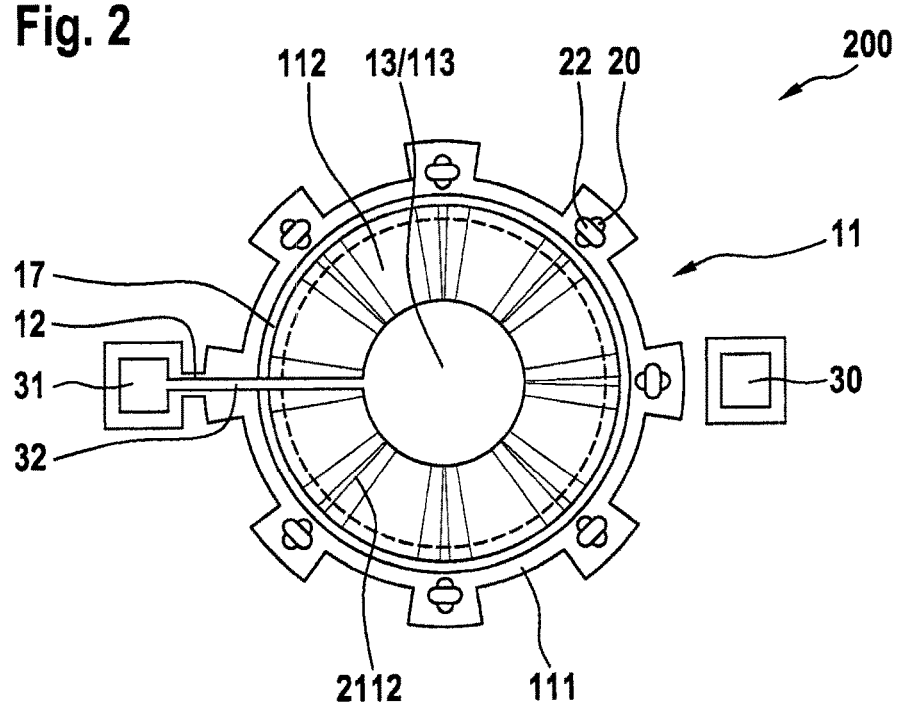
FIG. 2 shows a schematic top view of the layered structure of a second microphone component 200 according to the present invention including a back plate.

In FIG. 2, a top view of a microphone component 200 is illustrated, the structure of which essentially corresponds to microphone component 100 described above. The only essential difference between microphone components 100 and 200 is based on the implementation of the side area of the diaphragm. While in the case of microphone component 100, this side area 112 is simply formed in a truncated manner and thus connects edge area 111 to central area 113 of diaphragm 11, in the case of microphone component 200, side area 112 additionally includes radial corrugations 2112 with the aid of which the diaphragm structure is stabilized.

Figure 3:
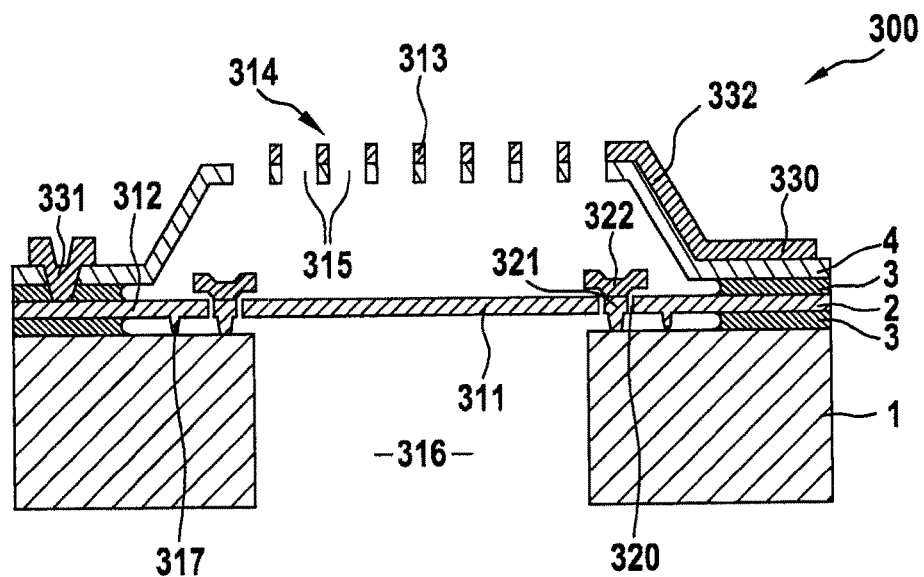
FIG. 3 shows a schematic sectional representation of a third microphone component 300 according to the present invention including a front plate.

The sectional representation of FIG. 3 shows one alternative specific embodiment for a microphone component 300 according to the present invention including a capacitive signal detection.

As in the case of microphone component 100, the microphone structure of microphone component 300 is implemented in a layered structure above a semiconductor substrate 1 and spans a cavern 316 in the back side of substrate 1. The microphone structure includes a sound-pressure sensitive diaphragm 311 and a fixed, acoustically permeable counter element 314 including through openings 315 which are situated in a raster-shaped manner.

In contrast to microphone component 100, diaphragm 311 is in this case structured out of an electrically conductive layer 2 between substrate 1 and functional layer 4 for counter element 314, this conductive layer 2 being electrically insulated in each case by at least one dielectric intermediate layer 3 against substrate 1 on the one hand and functional layer 4 on the other hand. Diaphragm 311 in this case functions itself as a deflectable electrode of a capacitor system for signal detection. Associated fixed counter electrode 313 of the capacitor system is situated on counter element 314 which is also referred to here as a front plate. The electrical contacting of the diaphragm takes place via a diaphragm contact 331 which is situated on the left next to the diaphragm area on the component surface in the representation of FIG. 3 and is implemented in the form of a via to diaphragm layer 2. Also on the component surface, however on the right next to the diaphragm area, a front plate contact 330 is situated via which counter electrode 313 is contacted.

Diaphragm 311 is also integrated only unilaterally via a cantilever beam 312 into the layered structure of component 300. Otherwise, it is completely separated from the layered structure, namely in such a way that the edge area of diaphragm 311 extends up to and beyond the edge area of cavern 316. In the overlap area between diaphragm 311 and edge area of cavern 316, an anchoring structure is formed which includes according to the present invention anchor elements 321 and through openings 320 for anchor elements 321. Anchor elements 321 are structured out of the layered structure above the edge area of cavern 316 and through openings 320 are formed in the edge area of diaphragm 311 so that the mechanical clearance between anchor elements 321 and corresponding through openings 320 allows for the mechanical stresses within diaphragm 311 to be relieved.

Anchor elements 321 are implemented in the form of pin-shaped extensions which extend from substrate 1 across diaphragm layer 2 and the two dielectric intermediate layers 3. In a layer 5 above diaphragm layer 2, one anchor head 322 which extends at least sectionally up to and beyond the edge area of the particular through opening 320 in diaphragm 311 is formed for each anchor element 321 in each case. There is a distance between anchor heads 322 and the diaphragm plane so that diaphragm 311 is deflectable as a whole from the diaphragm plane. Anchor heads 322 are used in this case as a stop against which diaphragm 311 is pulled in order to apply a defined mechanical pre-stressing to diaphragm 311 and to thus increase the microphone sensitivity. The circuit means necessary for this purpose are not illustrated individually in FIG. 3.

Furthermore, a sealing lip 317 for acoustically sealing the microphone structure is formed in the overlap area between diaphragm 311 and the edge area of cavern 316, namely on the bottom side of diaphragm 311. In contrast to microphone component 100, this circularly closed sealing lip 317 is situated between the anchoring structure and the outer edge of diaphragm 311.

In the case of microphone component 300, counter element 314 is situated in the layered structure above microphone diaphragm 311, as already mentioned. It has a "hat-shaped" design so that the plane parallel central area of counter element 314 which is situated centrically to cavern 316 and in which through openings 315 are also formed has a significantly larger distance from the diaphragm plane than the edge area of counter element 314 which is fixedly integrated into the layered structure. Counter electrode 313 extends essentially across the entire central area of counter element 314 and is electrically connected to front plate contact 330 via a connecting line 332.

In all three of the capacitive microphone components described above, it must be paid attention that the diaphragm including the diaphragm electrode and the counter element including the fixed counter electrode are electrically insulated with regard to one another and with regard to the substrate. This must also be taken into consideration when implementing the anchoring structure according to the present invention, in particular when the anchor elements function as a stop for the diaphragm. Short-circuits in the microphone structure may, for example, be avoided by using dielectric materials in the contact areas between the anchor elements and the diaphragm and at least one dielectric intermediate layer between the substrate and the anchor elements.

Figure 4:
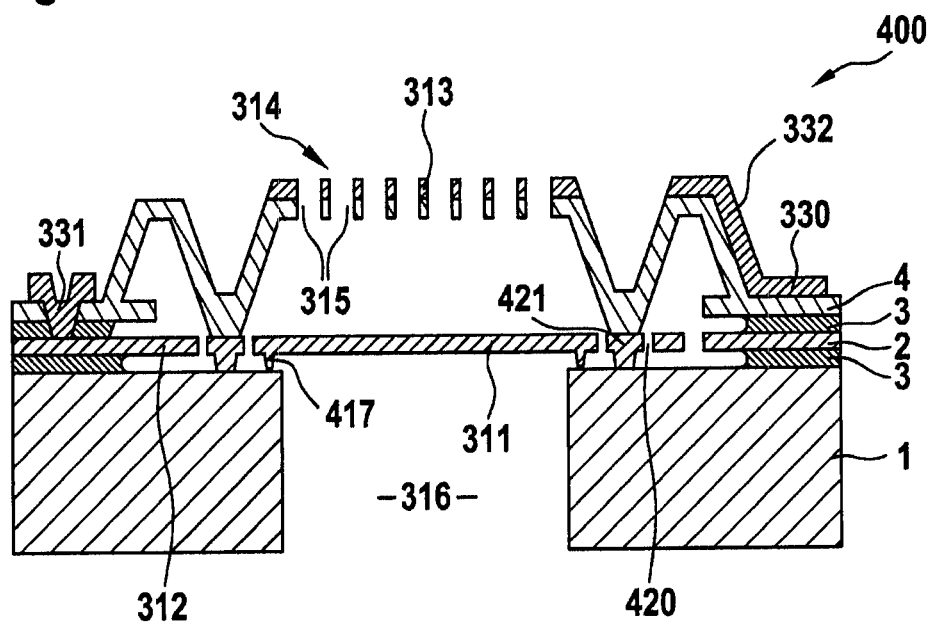
FIG. 4 shows a schematic sectional representation of a fourth microphone component 400 according to the present invention also including a front plate.

Microphone component 400 illustrated in FIG. 4 differs essentially only in the implementation of the anchoring structure and the acoustic sealing of the microphone structure from microphone component 300 described above. The following explanation is therefore limited to these aspects of the component structure. Incidentally, reference is made to the description of FIG. 3.

The anchoring structure of microphone component 400 is formed, as in the case of microphone component 300, in the overlap area between diaphragm 311 and the edge area of cavern 316 and includes according to the present invention anchor elements 421 and through openings 420 for anchor elements 421. Anchor elements 421 are structured out of the layered structure above the edge area of cavern 316. They extend from substrate 1 across a dielectric intermediate layer 3 and diaphragm layer 2 up into functional layer 4 of the counter element, so that anchor elements 421 are practically integrated into the edge area of counter element 314. Corresponding through openings 420 are formed in the edge area of diaphragm 311, so that the mechanical clearance between anchor elements 421 and corresponding through openings 420 allows for the mechanical stresses within diaphragm 311 to be relieved. The "out-of-plane" movement of diaphragm 311 is in the case of microphone component 400 not restricted or delimited by anchor elements 421.

In contrast to microphone component 300, circularly closed sealing lip 417 is situated on the bottom side of diaphragm 311 within the anchoring structure, i.e., between the cavern edge and the anchoring structure.

What is claimed is:

1. A micromechanical component, comprising:
    a diaphragm structure which is implemented in a layered structure on a substrate, the diaphragm structure including:
        a diaphragm which is integrated via at least one spring element into the layered structure, wherein the diaphragm spans a cavern and an edge of the cavern so that at least an edge area of the diaphragm is continuous with a central area of the diaphragm and extends beyond the edge of the cavern; and
        at least one anchoring structure formed in an overlap area containing the edge area of the diaphragm and an edge area of the substrate surrounding the cavern, wherein the anchoring structure includes at least one anchor element and one through opening for the anchor element, the anchor element being structured out of the layered structure above the edge area of the substrate surrounding the cavern, and the through opening for the anchor element being formed in the edge area of the diaphragm, wherein a clearance is provided surrounding the anchor element between the anchor element and the through opening, which mechanically separates the diaphragm from the anchor element to allow for a mechanical stress relaxation of the diaphragm.

2. The micromechanical component as recited in claim 1, wherein a foot of the anchor element is fixedly connected to the edge area of the substrate below the diaphragm, and a head of the anchor element is structured out of at least one layer above the diaphragm and includes a surface above and facing downward to the edge area of the diaphragm.

3. The micromechanical component as recited in claim 2, wherein the anchor element having the anchor head is configured to allow some out-of-plane movement of the diaphragm but act as a stop for further out-of-plane movement of the diaphragm.

4. The micromechanical component as recited in claim 2, further comprising:
    a control element, with the aid of which the diaphragm is moved into a defined position and maintained at the defined position.

5. The micromechanical component as recited in claim 2, wherein the at least one spring element for the diaphragm suspension is implemented in the form of an out-of-plane elastic spring element and an in-plane elastic spring element.

6. The micromechanical component as recited in claim 2, further comprising at least one sealing lip formed in the overlap area containing the edge area of the diaphragm and the edge area of the substrate surrounding the cavern.

7. The micromechanical component as recited in claim 6, wherein the anchoring structure is situated between the sealing lip and an outer edge of the diaphragm.

8. The micromechanical component as recited in claim 2, wherein the diaphragm includes a central area which is connected via a side area to the edge area of the diaphragm, so that the central area is formed to occupy a first plane substantially parallel, but offset, to a second plane occupied by the edge area of the diaphragm.

9. The micromechanical component as recited in claim 8, wherein the side area of the diaphragm includes corrugations for stabilizing the diaphragm structure.

10. The micromechanical component as recited in claim 3, further comprising:
    at least one electrode of a capacitor system provided on the diaphragm;
    a fixed, acoustically permeable counter element having at least one through opening formed in the layered structure at least one of above and below the diaphragm; and
    at least one counter electrode of the capacitor system formed on the acoustically permeable counter element,
    wherein the capacitor system is configured to detect an out-of-plane deflection of the diaphragm as a microphone signal.

11. The micromechanical component as recited in claim 1, wherein the at least one anchoring structure includes a plurality of the anchoring structures formed at intervals in the overlap area containing the edge area of the diaphragm and the edge area of the substrate surrounding the cavern.

12. The micromechanical component as recited in claim 1, wherein the at least one spring element includes a cantilever beam.

13. The micromechanical component as recited in claim 6, wherein the at least one sealing lip is formed on a bottom of the edge area of the diaphragm.

14. A micromechanical component, comprising:
    a diaphragm connected via at least one spring element into a layered structure formed on a substrate, the diaphragm spanning a cavern and an edge of the cavern so that an edge area of the diaphragm continuous with a central area of the diaphragm extends beyond the edge of the cavern and includes at least one through opening for at least one anchor element; and
    the at least one anchor element formed on an edge area of the substrate surrounding the cavern, wherein a clearance is provided surrounding the anchor element between the anchor element and the through opening to mechanically separate the diaphragm from the anchor element to allow for a mechanical stress relaxation of the diaphragm.

15. The micromechanical component as recited in claim 14, wherein the at least one anchor element includes a foot fixedly connected to the edge area of the substrate below the diaphragm, and a head structured out of at least one layer above the diaphragm, the head including a surface above and facing downward to the edge area of the diaphragm.

16. The micromechanical component as recited in claim 15, wherein the anchor head is configured as a stop for an out-of-plane movement of the diaphragm.

17. The micromechanical component as recited in claim 14, further comprising at least one sealing lip formed in an overlap area containing the edge area of the diaphragm and the edge area of the substrate surrounding the cavern.

18. The micromechanical component as recited in claim 17, wherein the anchoring structure is situated between the sealing lip and an outer edge of the diaphragm.

19. The micromechanical component as recited in claim 14, wherein the diaphragm includes a central area which is connected via a side area to the edge area of the diaphragm, so that the central area is formed to occupy a first plane substantially parallel, but offset, to a second plane occupied by the edge area of the diaphragm.

20. The micromechanical component as recited in claim 14, further comprising:
   at least one electrode of a capacitor system provided on the diaphragm;
   a fixed, acoustically permeable counter element having at least one through opening formed in the layered structure at least one of above and below the diaphragm; and
   at least one counter electrode of the capacitor system formed on the acoustically permeable counter element.

21. The micromechanical component as recited in claim 1, wherein the clearance allows for movement of the diaphragm relative to the anchor element to provide the mechanical stress relaxation of the diaphragm.

22. The micromechanical component as recited in claim 1, wherein the edge area of the diaphragm and a central area of the diaphragm move in a same direction in response to a force exerted on the diaphragm.

23. The micromechanical component as recited in claim 1, wherein the through opening is an aperture passing from a first surface of the edge area of the diaphragm facing the edge area of the substrate to a second surface of the edge area of the diaphragm facing away from the edge area of the substrate.

24. The micromechanical component as recited in claim 1, wherein the anchor element includes an anchor head having a stop portion above and facing downward to the edge area of the diaphragm.

25. The micromechanical component as recited in claim 24, wherein a second clearance is provided between the stop portion and the edge area of the diaphragm.

26. The micromechanical component as recited in claim 1, further comprising at least one sealing lip protruding from a bottom surface of the edge area of the diaphragm toward the edge area of the substrate.

* * * * *